United States Patent [19]

McKee et al.

[11] Patent Number: 5,470,761
[45] Date of Patent: Nov. 28, 1995

[54] PROCESS FOR FABRICATING A FRONT SURFACE RESONANT MESH ARRAY DETECTOR

[75] Inventors: Richard C. McKee, Ellicott City; Sandra L. Baumler, Crownsville, both of Md.

[73] Assignee: Westinghouse Electric Corporation, Pittsburgh, Pa.

[21] Appl. No.: 119,640

[22] Filed: Sep. 13, 1993

[51] Int. Cl.⁶ .................................................. H01L 31/16
[52] U.S. Cl. ...................... 437/5; 437/3; 437/4; 437/974; 148/DIG. 135
[58] Field of Search ................................... 437/5, 4, 3, 2, 437/974; 148/DIG. 135

[56] References Cited

U.S. PATENT DOCUMENTS

| | | | |
|---|---|---|---|
| 4,627,138 | 12/1986 | Im | 437/8 |
| 4,746,620 | 5/1988 | Diadiuk et al. | 437/3 |
| 4,927,771 | 5/1990 | Ferrett | 437/5 |
| 4,935,067 | 6/1990 | Sato et al. | 437/5 |
| 5,064,771 | 11/1991 | Solomon | 437/3 |
| 5,164,322 | 11/1992 | Yamazaki et al. | 437/3 |
| 5,182,217 | 1/1993 | Norton | 437/5 |
| 5,244,830 | 9/1993 | Kang et al. | 437/5 |
| 5,264,699 | 11/1993 | Barton et al. | 437/5 |

*Primary Examiner*—Kevin M. Picardat
*Attorney, Agent, or Firm*—Christopher O. Edwards

[57] ABSTRACT

A process for fabricating a front surface resonant mesh array detector produces a detector of reduced size. The reduced size results in enhanced responsivity, and minimizes thermal stress between the detector and typical array substrates, enabling fabrication of arrays using front surface resonant mesh array detectors.

15 Claims, 5 Drawing Sheets

5,470,761

PROCESS FOR FABRICATING A FRONT SURFACE RESONANT MESH ARRAY DETECTOR

BACKGROUND OF THE INVENTION

1. Field of the Invention

The present invention relates to infrared radiation detection, and, more particularly, to a process for fabricating a front surface resonant mesh array detector.

2. Description of Related Art

A front surface resonant mesh array detector employs an array of photodetector elements formed of an intrinsic photoconductive material, such as HgCdTe, to sense infrared radiation. The photodetector elements are positioned at a front surface of the detector so that they are directly exposed to incoming infrared radiation. In operation, the dc impedance of the photodetector elements varies in response to the level of infrared radiation received at the front surface of the detector. Thus, the dc impedance of the detector is monitored to sense the level of incoming radiation. A resonant cavity can be formed behind the photodetector elements to improve the responsivity of the detector to infrared radiation. The responsivity of the detector could be further enhanced by reducing the size of the photodetector elements. However, existing processes for fabricating a front surface resonant mesh array detector produce a relatively large detector.

In addition, it is difficult to construct area arrays or time delay and integration (TDI) arrays with detectors fabricated from the existing processes, due to the thermal mismatch between the large detector and the substrates used to fabricate such arrays. Thermal mismatch causes structural stress that increases as a function of the size of the detector relative to the substrate. Thus, the relatively large size of the detector fabricated by existing processes results in a significant level of thermal stress that inhibits the fabrication of area or TDI arrays using such detectors.

In light of the foregoing, a process for fabricating a front surface resonant mesh array detector of reduced size is desirable to minimize thermal stress problems that presently prevent the fabrication of area or TDI detector arrays. Moreover, a process for fabricating a front surface resonant mesh array detector of reduced size, while maintaining good quantum efficiency, is desirable to increase the responsivity of the detector.

SUMMARY OF THE INVENTION

Accordingly, the present invention provides a process for fabricating a front surface resonant mesh array detector of reduced size that provides enhanced responsivity to infrared radiation, and which is suitable for use in the fabrication of area or TDI detector arrays.

Additional advantages of the invention will be set forth in part in the description which follows, and in part will be obvious from the description, or may be learned by practice of the invention. The objects and advantages of the invention will be realized and attained by means of the process particularly pointed out in the written description and claims, as well as the appended drawings.

To achieve these and other advantages, and in accordance with the puose of the invention, as embodied and broadly described herein, the present invention is a process for fabricating a front surface resonant mesh array detector, comprising the steps of forming a photodetector film overlying a substrate, forming a dielectric film overlying the photodetector film, forming a reflective layer overlying the dielectric film, etching a plurality of substantially parallel grooves in the reflective layer, the dielectric film, and to a predetermined depth in the photodetector film, each adjacent pair of the grooves defining one of a plurality of photodetector elements therebetween, removing a first portion of the reflective layer to provide a first electrical contact to the photodetector elements, and a second portion of the reflective layer to provide a second electrical contact to the photodetector elements, removing the substrate to expose one side of the photodetector film, and etching the exposed side of the photodetector film to a depth sufficient to electrically isolate each of the plurality of photodetector elements from one another.

It is to be understood that both the foregoing general description and the following detailed description are exemplary and explanatory only and are not restrictive of the invention, as claimed.

The accompanying drawings, which are incorporated in and constitute a part of this specification, illustrate various stages in the process of the invention and together with the description, serve to explain the principles of the invention.

DETAILED DESCRIPTION OF THE INVENTION

Reference will now be made in detail to the process of the present invention, examples of which are illustrated in the accompanying drawings. Wherever possible, the same reference numbers will be used throughout the drawings to refer to the same or like parts.

Figure 1:
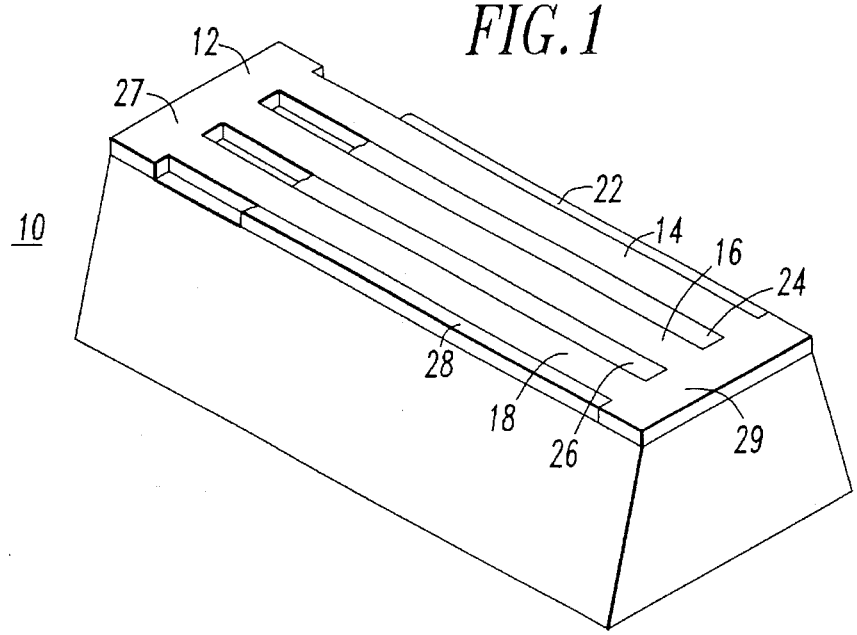
FIG. 1 is a perspective view of a single front surface resonant mesh array detector constructed in accordance with the process of the present invention.

In accordance with the present invention, there is provided a process for fabricating a front surface resonant mesh array detector A view of an exemplary front surface resonant mesh array detector fabricated according to the process of the invention is shown in FIG. 1, and is designated generally by reference numeral 10. The detector 10 includes a photodetector film 12 having a plurality of grooves 22, 24, 26, and 28 defining photodetector elements 14, 16, 18. FIGS. 2–8 are composite cross-sectional views illustrating successive stages in the process of fabricating the detector 10, and make reference to a first cross-section taken along line A'–A, a second cross-section taken along line A–B, and a third cross-section taken along line B–B' of detector 10.

Figure 2:
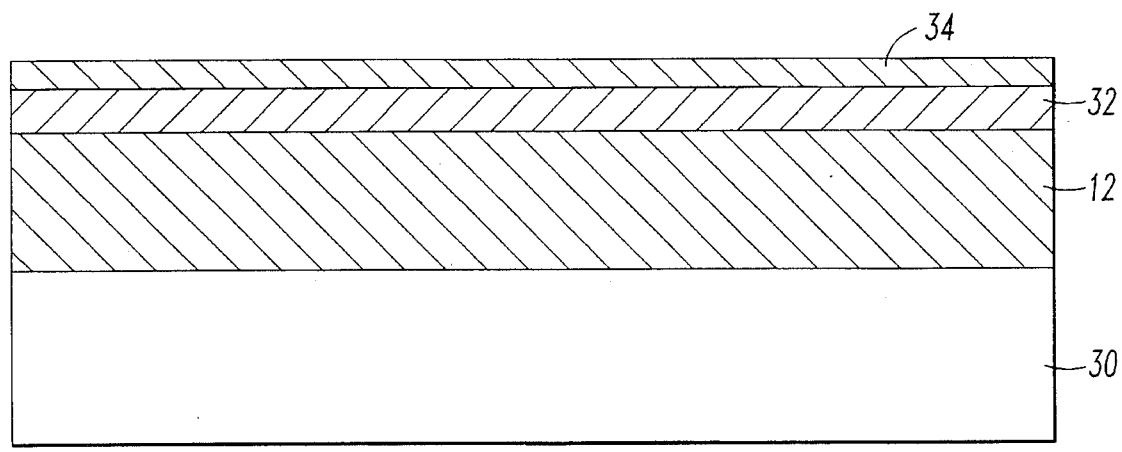
FIG. 2 is a composite cross-sectional view of the front surface resonant mesh array detector of FIG. 1 taken along lines A'-A, A-B, and B-B', at an initial stage in the process of the process of the invention.

As herein embodied and shown in FIG. 2, in accordance with the process of the present invention, a photodetector film 12 is first formed over a base substrate 30. The substrate 30 may comprise a semi-insulating material growth substrate such as, for example, CdZnTe. The photodetector film 12 is formed over substrate 30 by epitaxial growth of a thin film of p-type HgCdTe, or other intrinsic or extrinsic photoconductive material having an x value, carrier concentration, and minority carrier lifetime appropriate for infrared applications. The x value represents the stoichiometric ratio of the compound, $Hg_xCd_{1-x}Te$. A suitable HgCdTe photodetector film may have a p-type intrinsic carrier concentration of less han $10^{16}$ $cm^{-3}$ The photodetector film 12 is epitaxially grown to a thickness of approximately 2 μnm by a low temperature growth technique such as Metal Organic Chemical Vapor Deposition (MOCVD) or Molecular Beam Epitaxy (MBE). A dielectric film 32 is then formed over the photodetector film 12. This dielectric film 32 is formed by the in-situ growth of a CdTe film to a thickness of approximately 4000 Å. The growth of the dielectric film 32 is followed by the formation of a reflective layer 34 over film 32. The reflective layer 34 is provided by evaporating an approximtely 600 Å layer of Cr onto the dielectric film 32.

Figure 3:
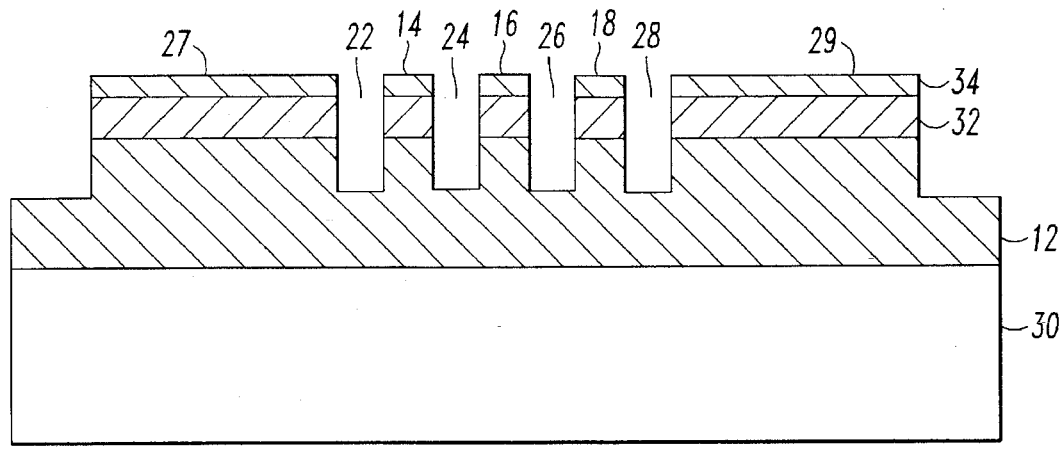
FIG. 3 is a composite cross-sectional view of the front surface resonant mesh array detector shown in FIG. 2 at a subsequent stage of the process of the invention following the formation of a plurality of grooves.

As indicated Ln FIG. 3, the reflective layer 34, dielectric film 32, and photodetector film 12 are subsequently etched to form parallel grooves 22, 24, 26, 28. First, the surface of the reflective layer 34 is coated with a photoresist. A first mask corresponding to the pattern of grooves 22, 24, 26, 28 is then applied to the surface of the reflective layer 34, and the photoresist is exposed to ultraviolet light. After development of the resist pattern, the reflective layer 34, dielectric film 32, and photodetector film 12 are dry-etched, as shown in FIG. 3, to fom grooves 22, 24, 26, and 28. Each adjacent pair of grooves defines one of a plurality of elongated photodetector elements 14, 16, 18 therebetween. For example, photodetector elements 14, 16, and 18 are defined by grooves 22 and 24, 24 and 26, and 26 and 28, respectively. The grooved pattern of the first mask is configured such that the grooves 22, 24, 26, 28 do not extend along the full length of the detector 10, but rather stop at a first end 27 and at a second end 29 of the photodetector elements 14, 16, 18, shown in FIG. 3. The opposite sides of the first and second ends 27, 29 can be seen from another perspective in FIG. 1. Thus, the photodetector elements 14, 16, 18 are commonly connected in parallel at the first end 27 and the second end 29. Although the portions of the reflective layer 34 and dielectric film 32 corresponding to grooves 22, 24, 26, and 28 are completely removed by the dry-etching step, the photodetector film 12 is etched only to a predetermined depth of approximately 7500 Å. The remaining portion of the photodetector film 12 thereby serves as a substrate etch stop fo subsequent process steps. Moreover, a depth of 7500 Å is the desired final thickness for optimum long-wave infrared response of the photodetector elements 14, 16, 18. Shorter wave infrared radiation detection requires thinner layers of the photodetection film 12. Each of the photodetector elements 14, 16, 18 includes a photodetector formed by the photodetector film 12, and an optical cavity provided by the combination of dielectric film 32 and reflective layer 34, which serves as a reflective mirror.

Figure 4:
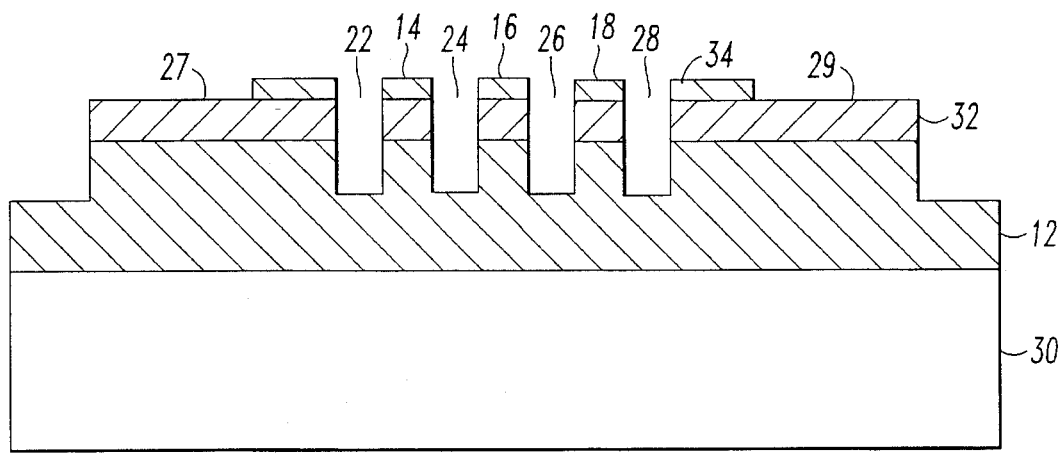
FIG. 4 is a composite cross-sectional view of the front surface resonant mesh array detector shown in FIG. 3 after definition of a reflective layer and detector isolation at another stage of the process of the invention.
Figure 5:
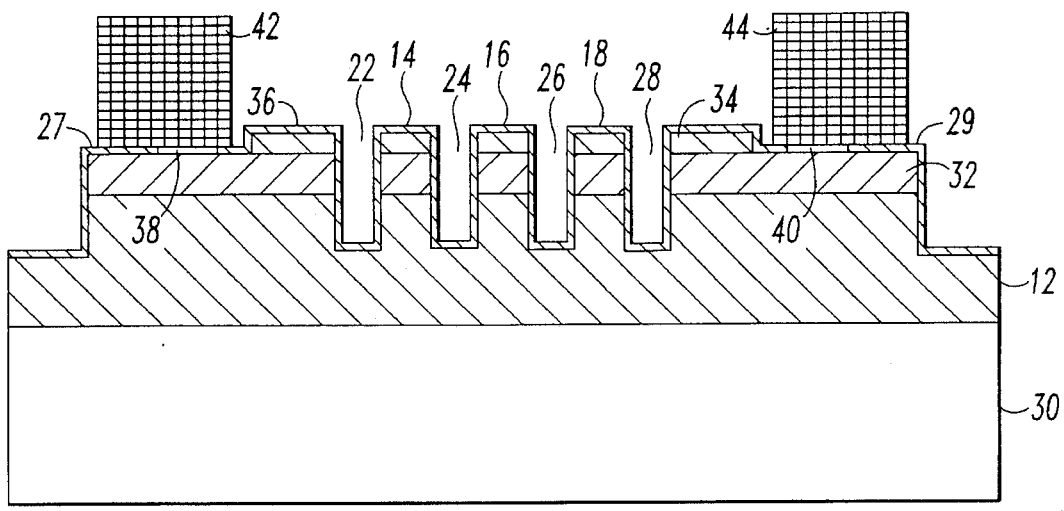
FIG. 5 is a composite cross-sectional view of the front surface resonant mesh array detector shown in FIG. 4 at a later stage of the process of the invention following the formation of electrical contacts an conductive contact bumps.

With reference to FIG. 4, the reflective layer 34 is defined and the photodetector elements 14, 16, 18 are isolated by removing portions of the reflective layer 34 overlying the first end 27 and the second end 29 of the photodetector elements 14, 16, 18. The reflective layer 34 is first coated with photoresist, and a second mask is applied, corresponding to the areas to be removed. The reflective layer 34 is then exposed to ultraviolet light, developed, and dry-etched to remove the portions of the reflective layer 34 covering the first and second ends 27, 29. Following the removal of the desired areas of reflective layer 34, the entire detector 10 is masked and etched for isolation of photodetector elements 14, 16, 18. Then, a passivation layer 36, such as $ZnS/SiO_2$, for example, is formed over the remaining areas of the reflective layer 34, and the exposed portions of the dielectric film 32 and photodetector film 12, as shown in FIG. 5.

Areas of the passivation layer 36 overlying the electrical contacts at the first and second ends 27, 29 of photodetector elements 14, 16, 18 are then removed to form first and second contact windows. To form the contact windows, photoresist is applied to the passivation layer 36, which is then covered with a third mask corresponding to the desired contact window pattern. After exposure and development, the passivation layer 36 is chemically etched to define the contact windows. The areas of the dielectric film 32 within the contact windows are then dry-etched, and a 400 Å Au layer is evaporated onto the dielectric film 32 to form coiltact pads 38 and 40 in the first and second contact windows, respectively. The photoresist used to form the contact window pattern is then washed out to define the Au contact pads 38, 40.

Next, first and second conductive contact bumps 42, 44 are formed over the electrical contacts. Specifically, a first conductive contact bump 42 is formed over the first contact window, and a second conductive contact bump 44 is formed over the second contact window. It is noted that the reflective layer 34 was removed in areas overlying the first and second ends 27, 29 principally to avoid electrical shorting of the first and second contact bumps 42, 44. The first and second conductive contact bumps 42, 44 are electrically coupled to the first and second ends 27, 29, respectively, of photodetector elements 14, 16, 18. For example, the first contact bump 42 is coupled via the contact pad 38 to the first end 27 of the photodetector elements 14, 16, 18. Similarly, contact pad 40 couples the second contact bump 44 to the second end 29 of the photodetector elements 14, 16, 18. To fabricate the contact bumps 42, 44, the detector structure is coated with photoresist, and a fourth mask is applied, corresponding to the areas in which the contact bumps 42, 44 are to be formed. After the masked photoresist is exposed and developed, it is etched to remove the contact bump areas of the photoresist overlying the first and second contact windows. A conductive material such as indium is then evaporated over the surface of the structure, and the remaining photoresist is lifted off, defining indium contact bump columns 42, 44.

Figure 6:
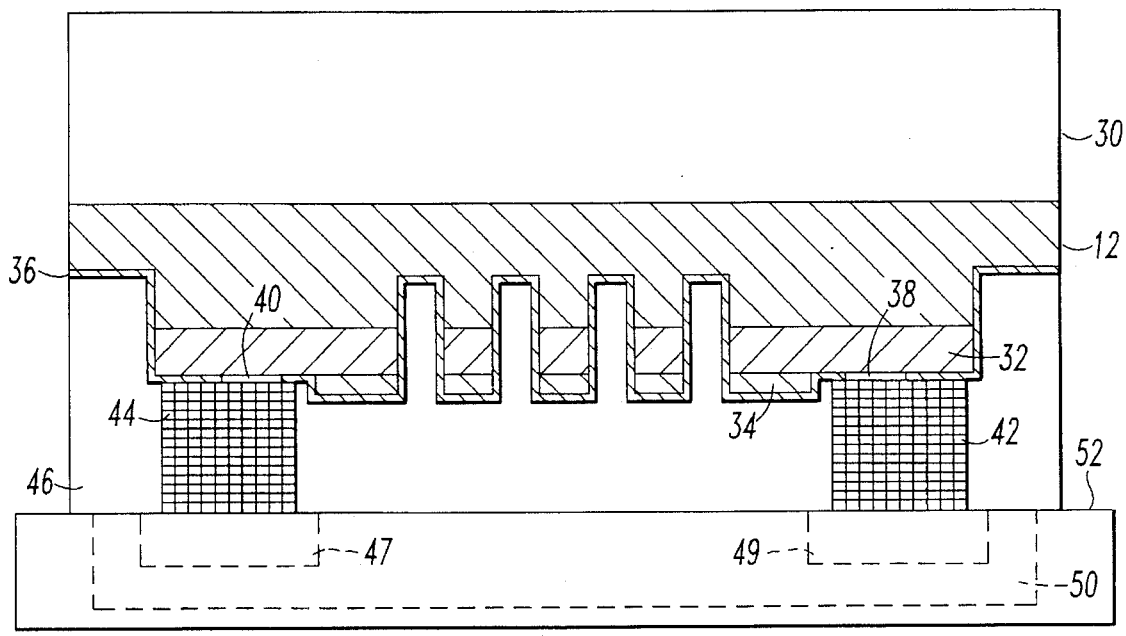
FIG. 6 is a composite cross-sectional view of the front surface resonantmesh array detector shown in FIG. 5 after the conductive contact bumps have been bonded to a multiplexer chip in accordance with the process of the invention.
Figure 9:
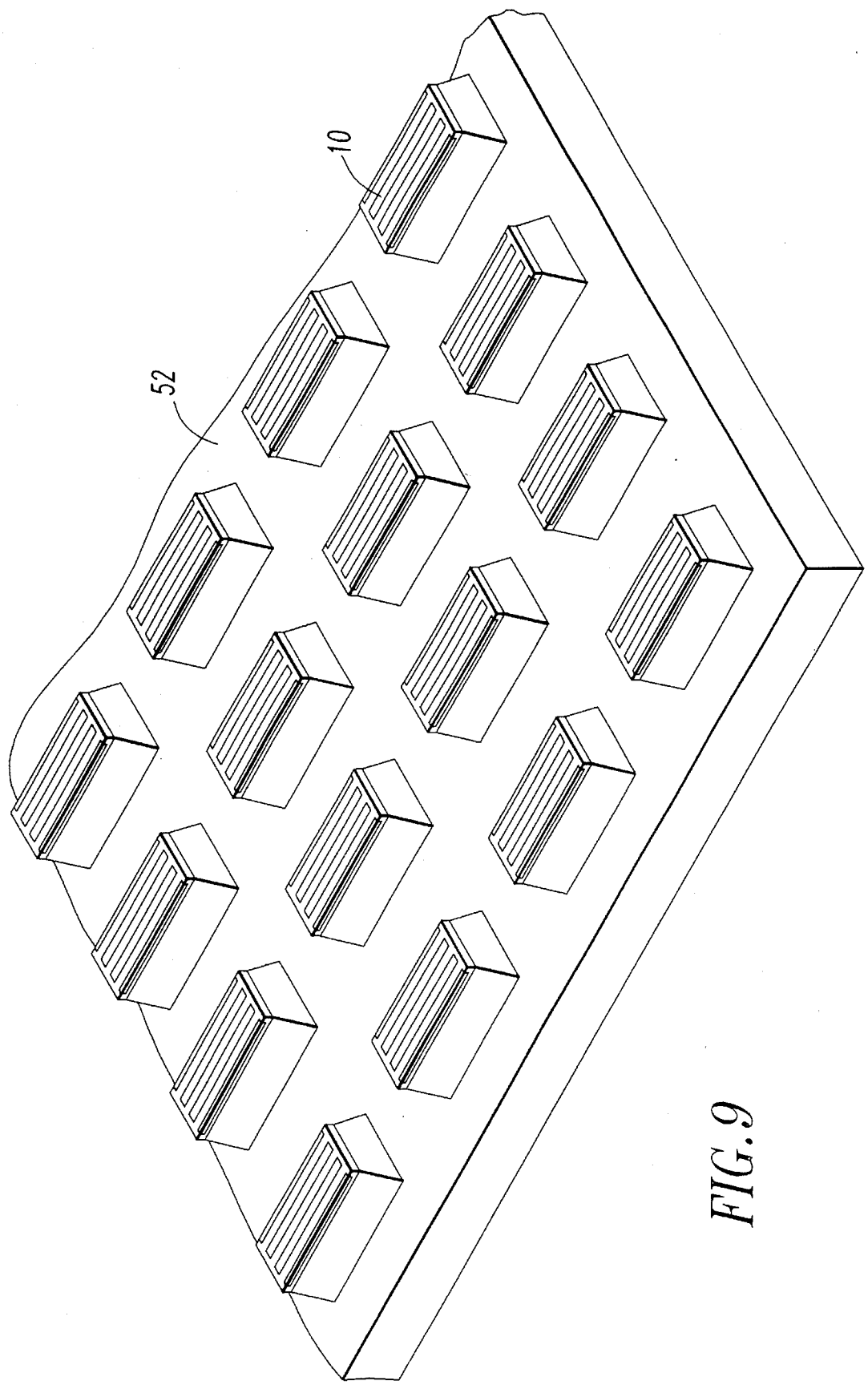
FIG. 9 is a partial perspective view of a large array of front surface resonant mesh array detectors, each of the detectors constructed as shown in FIG. 8.

For purposes of the description above, the drawings illustrate the fabrication of a single detector 10. However, after the step of detector isolation described with respect to FIG. 4, a plurality of detectors 10 can be attached to a multiplexer chip 52, as shown in FIG. 6, and further processed, to build an area or TDI detector array. An array of front surface resonant mesh array detectors 10 is shown in FIG. 9, coupled to the surface of multiplexer chip 52. An array of individual detectors 10 can be attached to the multiplexer chip 52 by effectively turning the structure shown in FIG. 5 "upside-down," and then bonding the first and second conductive contact bumps 42, 44 to the surface of the multiplexer chip 52. Because the orientation of the structure shown in FIG. 5 is inverted in FIG. 6, the cross-sections of the composite illustration of FIG. 6 are also inverted. Before the detector 10 is further processed, the interface between the passivation layer 36 and the multiplexer chip 52 is back-filled with cement 46, such as epoxy, to provide structural stability. As a result, the grooves 22, 24, 26, 28 are filled, as also indicated in the simplified diagram of FIG. 1.

The multiplexer chip 52 includes metallization layers, represented in FIG. 6 as areas 47 and 49, that provide conductive paths between the contact bumps 42, 44 and an input circuit of the multiplexer chip 52. The input circuit, represented by area 50, is used to process the signal generated by the detector 10. For every detector 10, there exists an input circuit 50 on the multiplexer chip 52. The multiplexer chip 52 incorporates an n×m array of input circuits 50 to match an n×m array of detectors 10. The main function of the multiplexer chip 52 is to receive the sensed information from each of the detectors 10, via the input circuit, and to arrange and output this information typically in a serial format.

Figure 7:
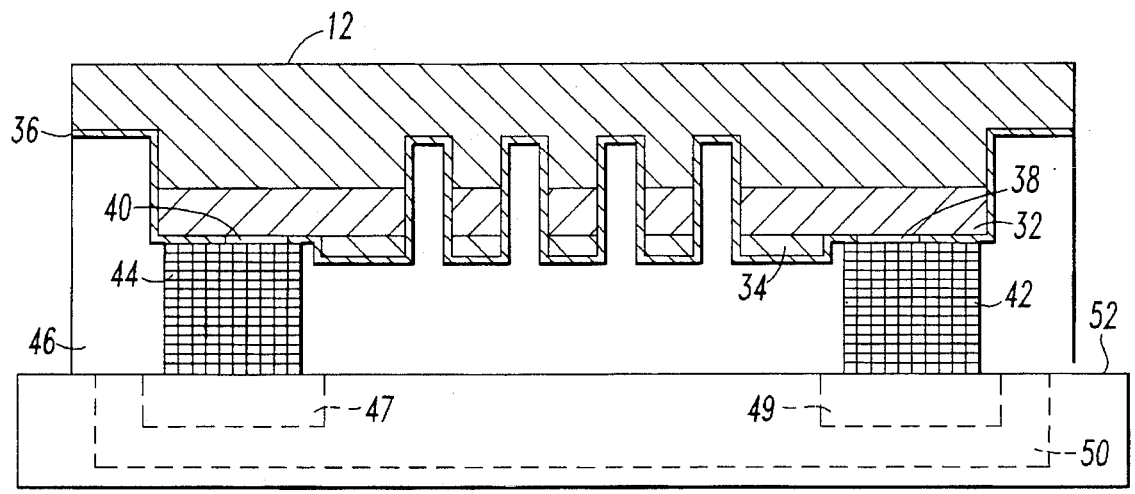
FIG. 7 is a composite cross-sectional view of the front surface resonant mesh array detector shown in FIG. 6 at an advanced stage of the process of the invention following the removal of a base substrate.
Figure 8:
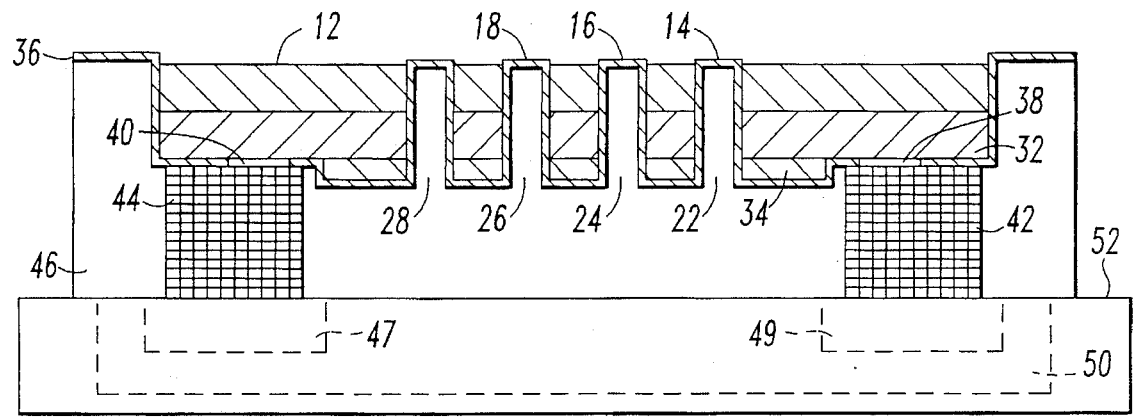
FIG. 8 is a composite cross-sectional view of a completed front surface resonant mesh array detector after the HgCdTe layer has been thinned in accordance with the process of the invention.

After the contact bunps 40, 44 are bonded to the surface of the multiplexer chip 52, the chip 52 is coated with black wax. As shown in FIG. 7, the semi-insulating substrate 30 is then completely removed by a chemical etchant selected such that the photodetector film 12 acts as an etch stop. The black wax is subsequently removed with a solvent. An optional way to isolate the detectors 10 is to protect the multiplexer chip 52 with a resist, and then dry-etch the side of the photodetector film 12 from which the substrate 30 was removed to a depth sufficient to electrically isolate each of the photodetector elements 14, 16, 18 from one another. The dry-etch is followed by a wet chemical free etch to remove any surface damage from the photodetector film 12. An example of the resultant structure of the detector 10 after the photodetector film 12 is etched is shown in FIG. 8. As a further measure, a passivation layer can be deposited over the detector 10 shown in FIG. 8, and the protective resist washed out over the multiplexer chip 52.

The fabrication process of the present invention enables the size of the front surface resonant mesh array detector to be reduced by a factor of greater than 100 relative to the detector produced by existing processes. As a result, the thermal stress problems encountered in the fabrication of area and TDI arrays can be minimized by employing detectors fabricated in accordance with theprocess of the present invention. In addition, the substantial reduction in size provided by the process of the present invention enables the responsivity of the front surface resonant mesh array detector to be enhanced.

Having described the presently preferred embodiments of the invention, additional advantages and modifications will readily occur to those skilled in the art from consideration of the specification and practice of the invention disclosed herein. It is intended that the specification and examples be considered as exemplary only, with a true scope and spirit of the invention being indicated by the following claims.

We claim:

1. A process for fabricating a front surface resonant mesh array detector, comprising the steps of:
   forming a photodetector film overlying a substrate;
   forming a dielectric film overlying said photodetector film;
   forming a reflective layer overlying said dielectric film;
   etching a plurality of parallel grooves in said reflective layer, said dielectric film, and in said photodetector film, each adjacent pair of said grooves defining one of a plurality of photodetector elements therebetween;
   removing a first portion of said reflective layer to provide a first electrical contact to said photodetector elements, and a second portion of said reflective layer to provide a second electrical contact to said photodetector elements;
   removing said substrate to expose one side of said photodetector film; and
   etching the exposed side of said photodetector film to a depth sufficient to electrically isolate each of said plurality of photodetector elements from one another.

2. The process of claim 1, further comprising the step of forming a first conductive contact bump overlying at least a portion of said first electrical contact, and a second conductive contact bump overlying at least a portion of said second electrical contact.

3. The process of claim 2, further comprising the step of bonding said first and second conductive contact bumps to a surface of a multiplexer chip, said first and second conductive contact bumps being electrically coupled to respective metallization layers disposed in said multiplexer chip.

4. The process of claim 3, further comprising the step of applying cement to an interface between said photodetector elements and said multiplexer chip to structurally stabilize said photodetector elements.

5. The process of claim 2, further comprising the steps of forming a passivation layer over said reflective layer and said dielectric film after said step of removing said portions of said reflective layer, and before said step of forming said first and second conductive contact bumps removing a portion of said passivation layer overlying said first electrical contact to form a first contact window and removing a portion of said passivation layer overlying said second electrical contact to form a second contact window.

6. The process of claim 5, further comprising the step of forming a first conductive contact pad in said first contact window and a second conductive contact pad in said second contact window before said step of forming said first and second conductive contact bumps.

7. The process of claim 2, wherein said first and second conductive contact bumps comprise indium.

8. The process of claim 1, wherein said step of forming said photodetector film comprises forming a HgCdTe film and said step of forming said dielectric film comprises forming a CdTe film.

9. The process of claim 8, wherein said step of forming said photodetector film comprises epitaxially growing said HgCdTe film on said substrate, and said step of forming said dielectric film comprises epitaxially growing said CdTe film on said photodetector film.

10. The process of claim 9, wherein said step of epitaxially growing said HgCdTe film comprises epitaxially growing said HgCdTe film to a thickness of approximately 2 μm, and said step of epitaxially growing said CdTe film comprises epitaxially growing said CdTe film to a thickness of approximately 4000 Å.

11. The process of claim 10, wherein said step of etching said plurality of parallel grooves comprises etching said plurality of grooves to a depth of approximately 7500 Å in said HgCdTe film.

12. The process of claim 11, wherein said step of forming said reflective layer comprises forming a layer of chromium overlying said CdTe film.

13. The process of claim 12, wherein said step of forming said layer of chromium comprises forming a layer of chromium having a thickness of approximately 600 Å.

14. The process of claim 1, wherein said step of forming said photodetector film comprises epitaxially growing said photodetector film on said substrate, and said step of forming said dielectric film comprises epitaxially growing said dielectric film on said photodetector film.

15. The process of claim 1, further comprising the step of forming a plurality of said front surface resonant mesh array detectors, and coupling each of said plurality of front surface resonant mesh array detectors to a multiplexer chip to form an array.

* * * * *